(12) United States Patent
Zhu

(10) Patent No.: US 7,828,574 B2
(45) Date of Patent: Nov. 9, 2010

(54) EDGE CONNECTOR FOR REVERSE INSERTION OF DAUGHTER BOARD

(75) Inventor: Jian-Kuang Zhu, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/315,392

(22) Filed: Dec. 3, 2008

(65) Prior Publication Data

US 2009/0142944 A1 Jun. 4, 2009

(30) Foreign Application Priority Data

Dec. 3, 2007 (CN) .................. 2007 1 0190571

(51) Int. Cl.
*H01R 13/62* (2006.01)
(52) U.S. Cl. ................... 439/328; 439/326
(58) Field of Classification Search ............ 439/326, 439/327–329, 630, 260
See application file for complete search history.

(56) References Cited

U.S. PATENT DOCUMENTS

| | | | | |
|---|---|---|---|---|
| 3,701,071 A * | 10/1972 | Landman | ............... | 200/5 R |
| 4,678,252 A * | 7/1987 | Moore | ............... | 439/62 |
| 5,268,820 A * | 12/1993 | Tseng et al. | ............... | 361/785 |
| 6,234,820 B1 * | 5/2001 | Perino et al. | ............... | 439/326 |
| 6,850,409 B1 * | 2/2005 | Triebes et al. | ............... | 361/679.32 |
| 6,926,549 B2 * | 8/2005 | Wang | ............... | 439/326 |
| 6,955,554 B2 * | 10/2005 | Korsunsky et al. | ............... | 439/328 |
| 7,021,953 B2 * | 4/2006 | Kawamae | ............... | 439/326 |
| 7,114,974 B2 * | 10/2006 | Korsunsky et al. | ............... | 439/325 |
| 7,134,895 B1 * | 11/2006 | Choy et al. | ............... | 439/326 |
| 7,134,896 B1 * | 11/2006 | Chen | ............... | 439/326 |
| 7,182,618 B1 * | 2/2007 | Choy et al. | ............... | 439/328 |
| 7,241,159 B1 * | 7/2007 | Chen | ............... | 439/326 |
| 7,294,009 B1 * | 11/2007 | Peng et al. | ............... | 439/326 |
| 7,300,298 B2 * | 11/2007 | Kameda | ............... | 439/326 |
| 7,300,299 B2 * | 11/2007 | Wang et al. | ............... | 439/326 |
| 7,534,146 B2 * | 5/2009 | Chien et al. | ............... | 439/668 |
| 7,540,742 B2 | 6/2009 | Hardell | | |
| 7,628,655 B1 * | 12/2009 | Chen | ............... | 439/660 |
| 2003/0171014 A1 * | 9/2003 | Lin | ............... | 439/79 |
| 2004/0152353 A1 * | 8/2004 | Kawamae | ............... | 439/328 |

(Continued)

FOREIGN PATENT DOCUMENTS

CN    2909587 Y    6/2007

(Continued)

*Primary Examiner*—T C Patel
*Assistant Examiner*—Harshad C Patel
(74) *Attorney, Agent, or Firm*—Andrew C. Cheng; Wei Te Chung; Ming Chieh Chang

(57) ABSTRACT

An edge connector assembly includes a PCB defining a first face, a second face opposite to the first face thereof and a notch therein, a daughter board defining a front mating portion and a rear retaining portion and an edge connector mounted in the notch of the PCB. The connector includes an insulating housing defining a longitudinal slot for receiving the front mating portion of the daughter board and a mounting face thereof to abut against the first face of the PCB, a plurality of contacts defining contacting portions extending into the slot. The daughter board is inserted into slot from the second face of the PCB in a slant direction and then pivots about the front mating portion and is retained in the notch.

16 Claims, 8 Drawing Sheets

U.S. PATENT DOCUMENTS

| | | | |
|---|---|---|---|
| 2005/0048828 A1* | 3/2005 | Ho et al. | 439/326 |
| 2007/0032116 A1* | 2/2007 | Liang | 439/326 |
| 2007/0059964 A1* | 3/2007 | Choy et al. | 439/328 |
| 2007/0202732 A1* | 8/2007 | Yahiro et al. | 439/326 |

FOREIGN PATENT DOCUMENTS

| | | |
|---|---|---|
| JP | 11-8028 | 1/1999 |

* cited by examiner

EDGE CONNECTOR FOR REVERSE INSERTION OF DAUGHTER BOARD

BACKGROUND OF THE INVENTION

1. Field of the Invention

The present invention relates to an electrical connector, and more particularly to an edge connector with daughter boards such as memory card or the like rotatably inserted thereinto and locked therein in a parallel position.

2. Description of Related Art

A conventional card edge connector, which includes a longitudinal card-inserting slot and two rows of contacts arranged on two opposite sides of the slot. The connector is assembled on a mother board or a PCB and an memory card is downwards inserted into the card-inserting slot in a slant-wise direction relative to the PCB and then downwards rotates until parallel to the PCB and locked by a latching device, wherein resilient contacting portions of the contacts touch corresponding electrical pads of the card to complete a connection of the card and the PCB. To meet different usage circumstance, varies edge connectors are required and development.

SUMMARY OF THE INVENTION

An object of the present invention is to provide an edge connector with reverse insertion of a daughter board.

In order to achieve above-mentioned object, an edge connector assembly includes a PCB defining a first face, a second face opposite to the first face thereof and a notch therein, a daughter board defining a front mating portion and a rear retaining portion and an edge connector mounted in the notch of the PCB. The connector includes an insulating housing defining a longitudinal slot for receiving the front mating portion of the daughter board and a mounting face thereof to abut against the first face of the PCB, a plurality of contacts defining contacting portions extending into the slot. The daughter board is inserted into slot from the second face of the PCB in a slant direction and then pivots about the front mating portion and is retained in the notch.

Other objects, advantages and novel features of the present invention will become more apparent from the following detailed description of the present embodiment when taken in conjunction with the accompanying drawings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
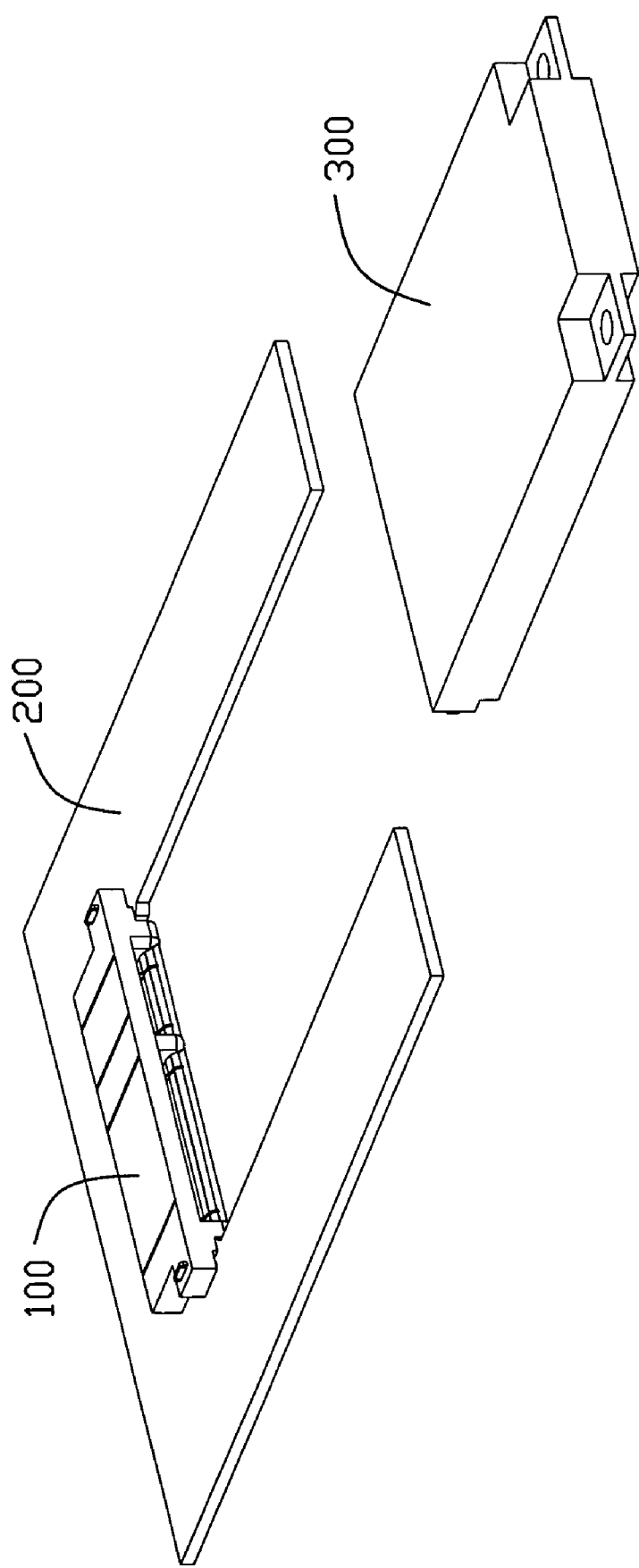
FIG. 1 is a perspective view of an edge connector assembled in PCB and a card in accordance with the present invention.

Reference will be made to the drawing figures to describe the present invention in detail, wherein depicted elements are not necessarily shown to scale and wherein like or similar elements are designated by same or similar reference numeral through the eight views and same or similar terminology.

Figure 2:
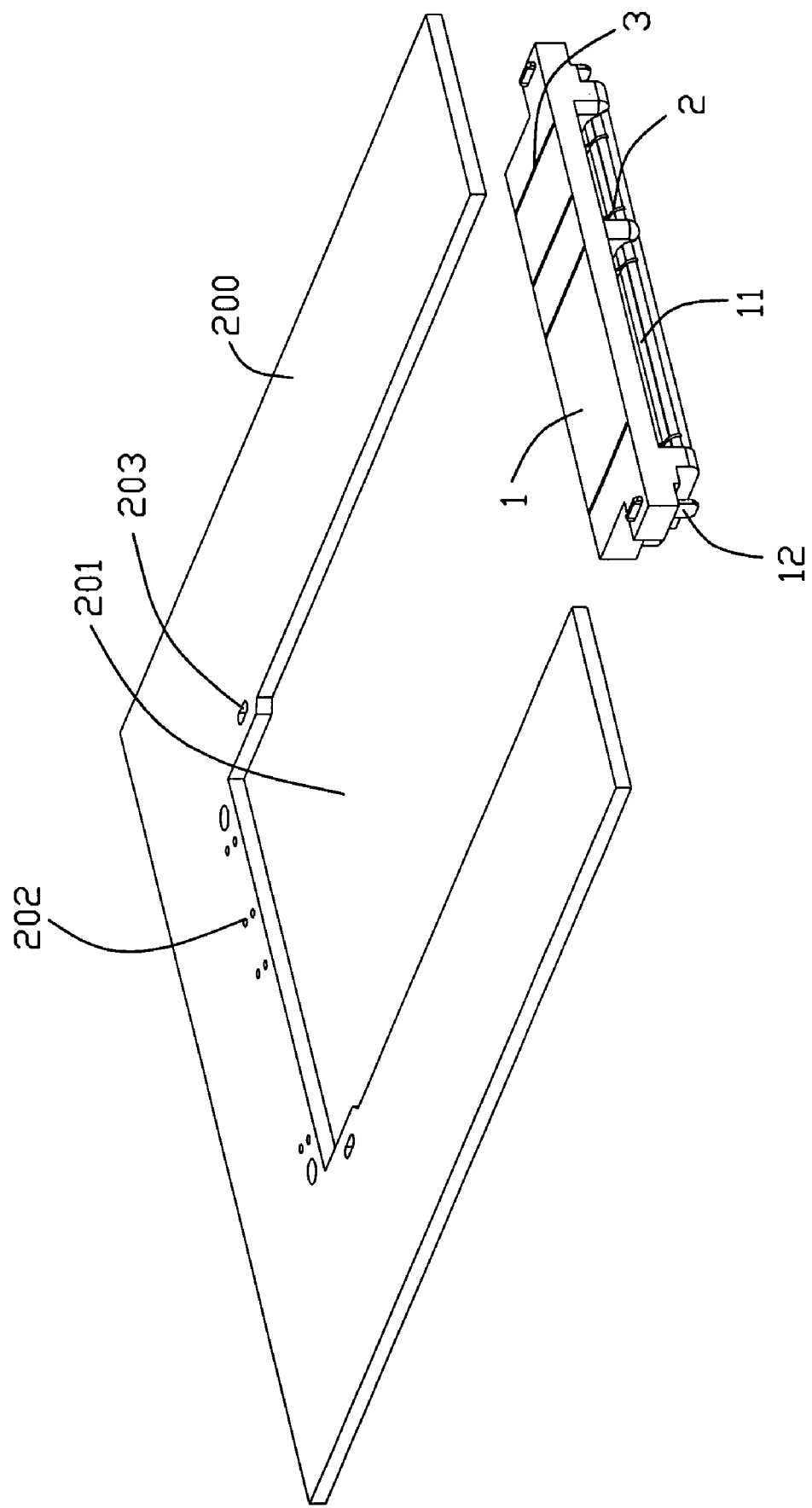
FIG. 2 is a perspective view of edge connector and the PCB of FIG. 1.

Referring to FIG. 1, a sunk type card edge connector 100 is adapted for being assembled in a large notch of a PCB 200 and being inserted by a daughter board such as memory card 300 or the like, so as to complete electrical connection between the PCB and the card. As shown in FIG. 2, the connector includes an insulating housing 1 with a forward-opening card-receiving slot 11 along a longitudinal direction and a plurality of conductive terminals 2, 3 (only somewhat are shown in FIG. 2 for simplify) located in opposite inside walls of slot 11. The plurality of terminals is arranged offsetting along the longitudinal direction. The PCB 200 has corresponding terminal holes 202 at an inner edge thereof, opposite to a front opening of the notch 201 of PCB, to be inserted and soldered by the soldering legs of the terminals. The PCB has two holes 203 at side edges adjacent to the inner edge thereof to be inserted and retained by a pair of metallic board locks 12 retained in opposite end flanges of the housing so as to retain the housing in the notch 201.

Figure 3:
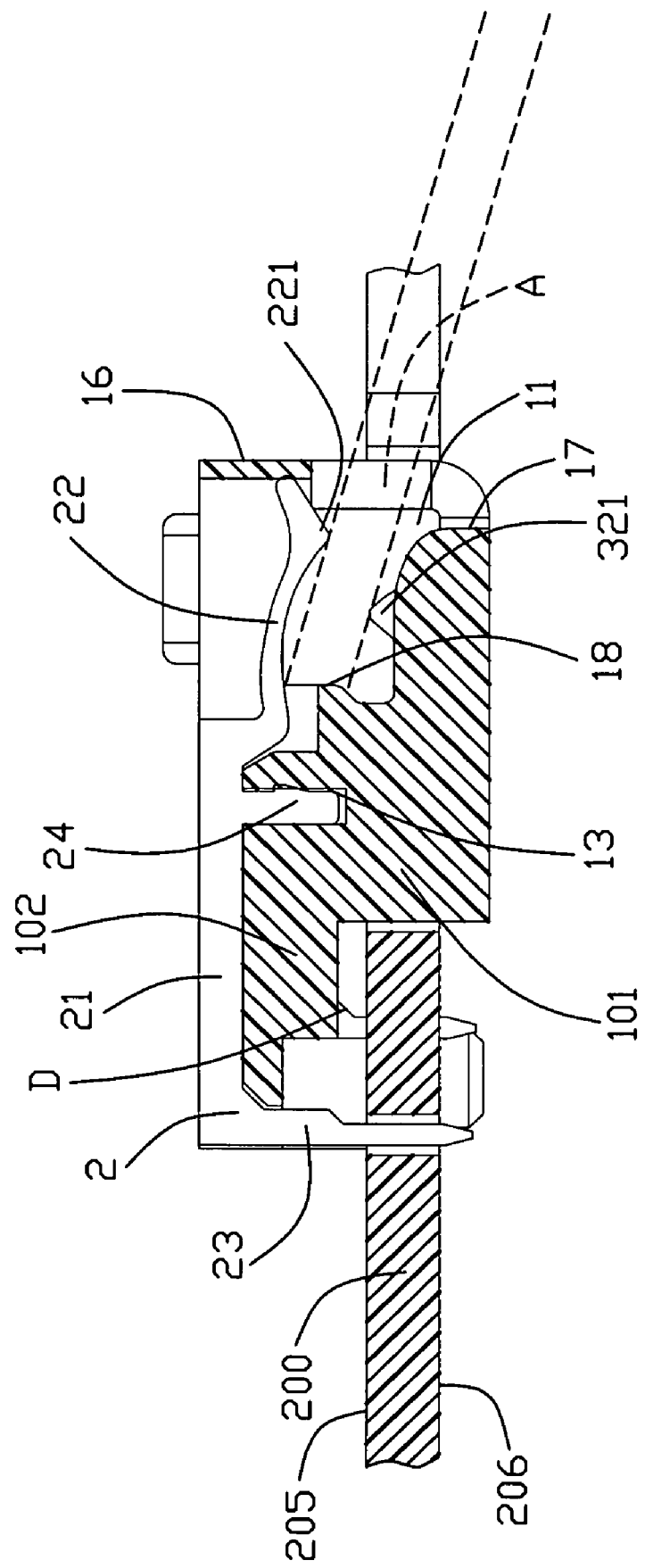
FIG. 3 is an schematic cross-section view of the connector in FIG. 1 to show the configuration of the terminal of the upper row.

Referring to FIG. 3, the first terminals 2 of one upper row are arranged over the slot. Each terminal 2 includes a longitudinal base portion 21, a resilient contacting portion 22 extending forward and downwards into the slot 11 from a front end of the base portion and a soldering leg 23 perpendicular bending downward from a back end of the base portion 21. A retaining portion 24 with tabs at sides thereof, perpendicularly extends from the base portion near to the front end of the base portion and is retained in the slit 13 opening upward 13 so that the first terminals of the upper row are inserted into corresponding passageways which are on and through the top face of the housing from an upper-to-downward direction. The soldering legs 23 are supported against the back of the housing.

Figure 4:
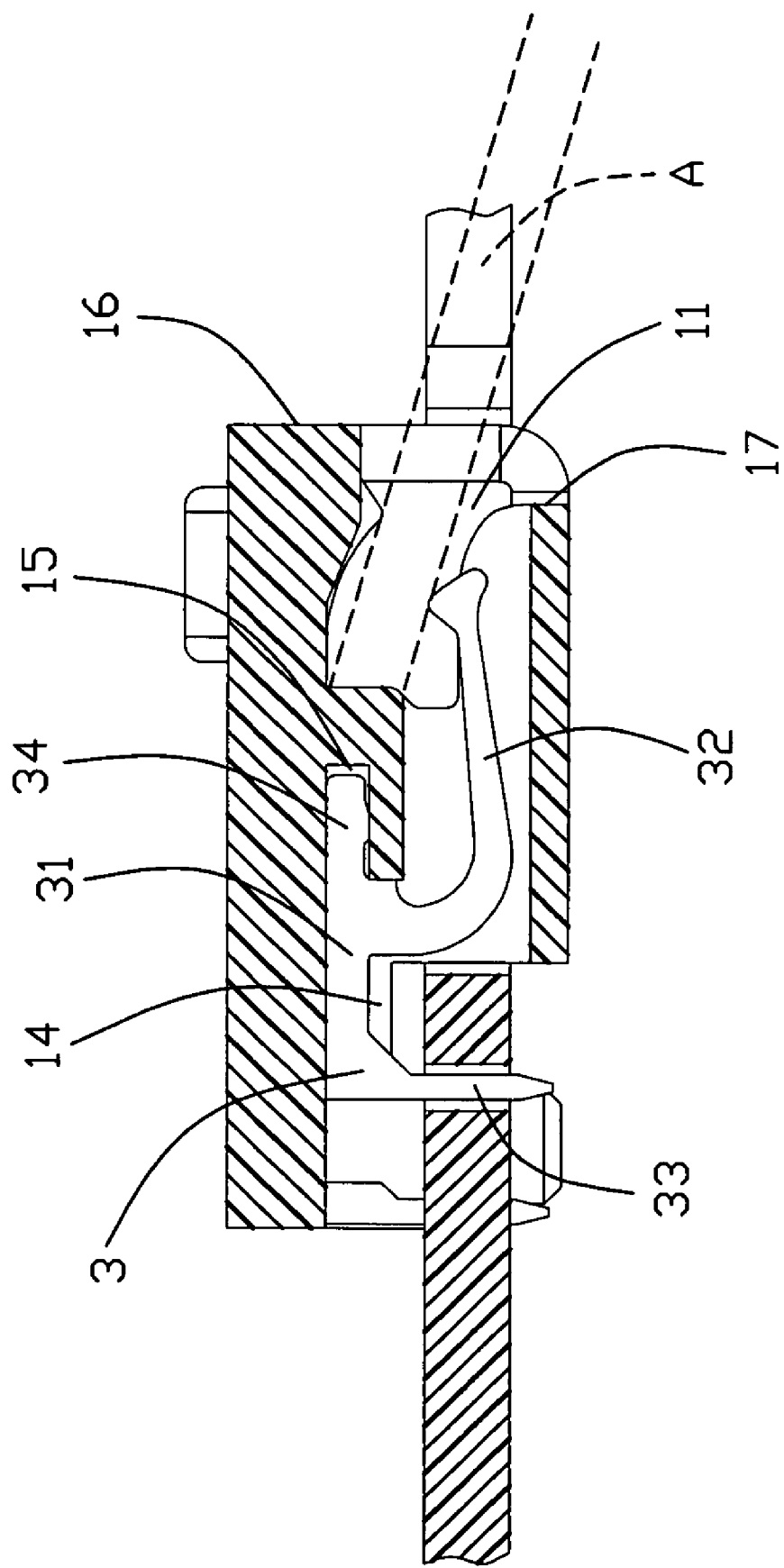
FIG. 4 is an schematic cross-section view of the connector in FIG. 1 to show the configuration of the terminal of the lower row.

Referring to FIG. 4, the second terminals 2 of one lower row are arranged on the lower wall and below the slot 11. Each terminal 3 includes a base portion 31, a resilient contacting portion 32 extending downwards first and then bending forward into the slot 11 from a front end of the base portion and a soldering leg 33 perpendicular bend downward from a back end of the base portion. A retaining portion 34 with tabs at sides thereof, forward projects from the front end of the base portion 31 and are inserted into a slit 15 opening rearwards in a rear-to-front direction. The soldering legs 33 of the second terminals are arranged in front of the soldering legs of the first terminals.

Referring to FIGS. 3 and 4, the housing has a front portion 101 and a rear portion 102 larger and lower than the front portion 101 (with respect to a top face 205 of the PCB in a normal state). The front portion 101 is embedded in the notch 201 of the PCB and the rear portion 102 defines a mounting face D confronting to the top face of the PCB. The contacting points 221, 231 at free ends of the contacting portions 22, 32 expose in the slot 11, wherein the contacting points of the second terminals are nearer to a front opening of the slot 11 than that of the first terminals, i.e. far from an inner face 18 facing the front opening of the slot 11 so as to form a downward slant inserted space A as shown in broken line. The inserted space A slants downwards to the PCB from an upper lever. The front face 17 of the lower wall is in front of the front face 16 of the upper wall.

Figure 5:
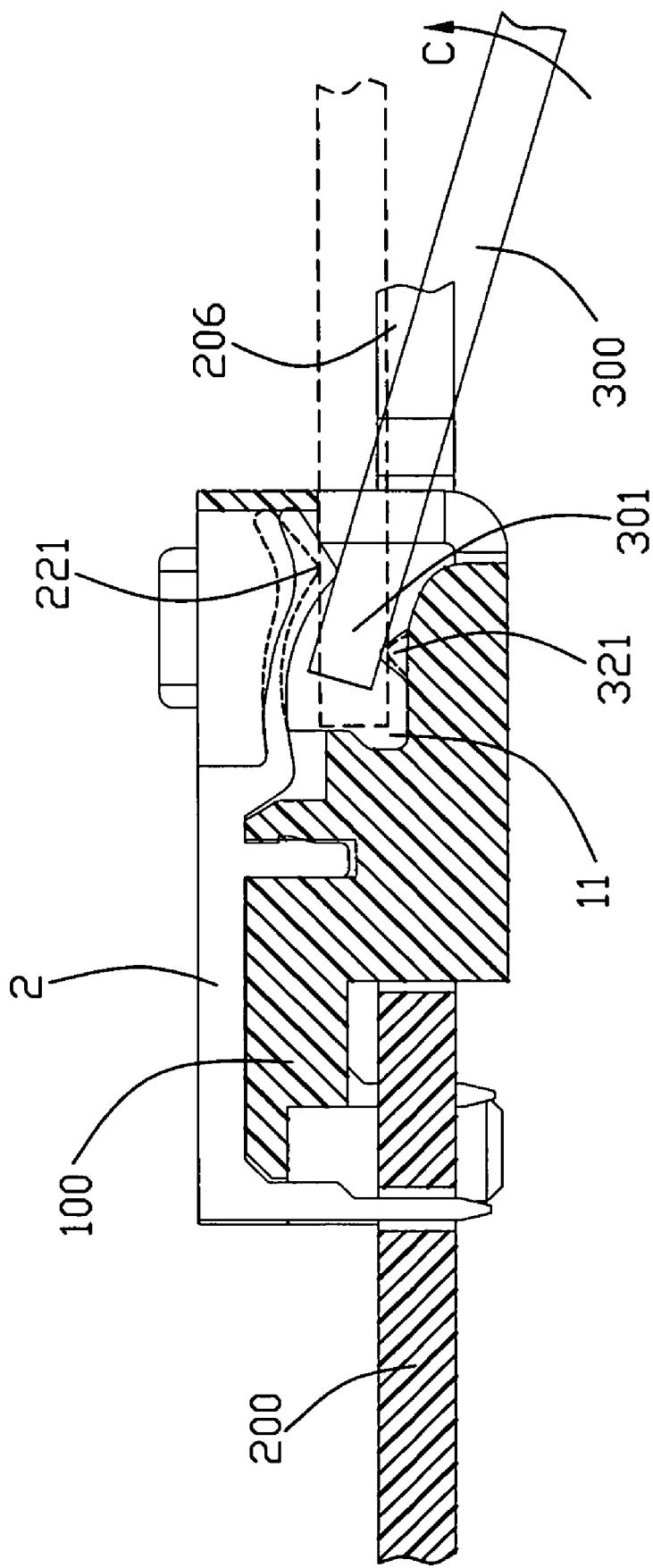
FIG. 5 is similar to FIG. 3 wherein the card is inserted into the connector.

Referring to FIG. 5, the card 300 is inserted into the slot 11 along the inserted space A and then pivot the card on one direction C about a front mating edge portion 301 until the card is parallel to the PCB and locked by the latching device 6 which will be described hereinafter. The connector 100 is assembled in the notch 201 in a normal direction, in another word, from the top face 205 of the PCB to a lower face of the PCB, while the card is inserted from the lower face 206 of the PCB with a reverse direction. In application, the connector is located in an electronic apparatus such as notebook or the like and users can insert the card from the bottom of the notebook, which will facility the replacement of an iffy card in the notebook through a large opening in the bottom of the notebook without taking apart the notebook.

Figure 6:
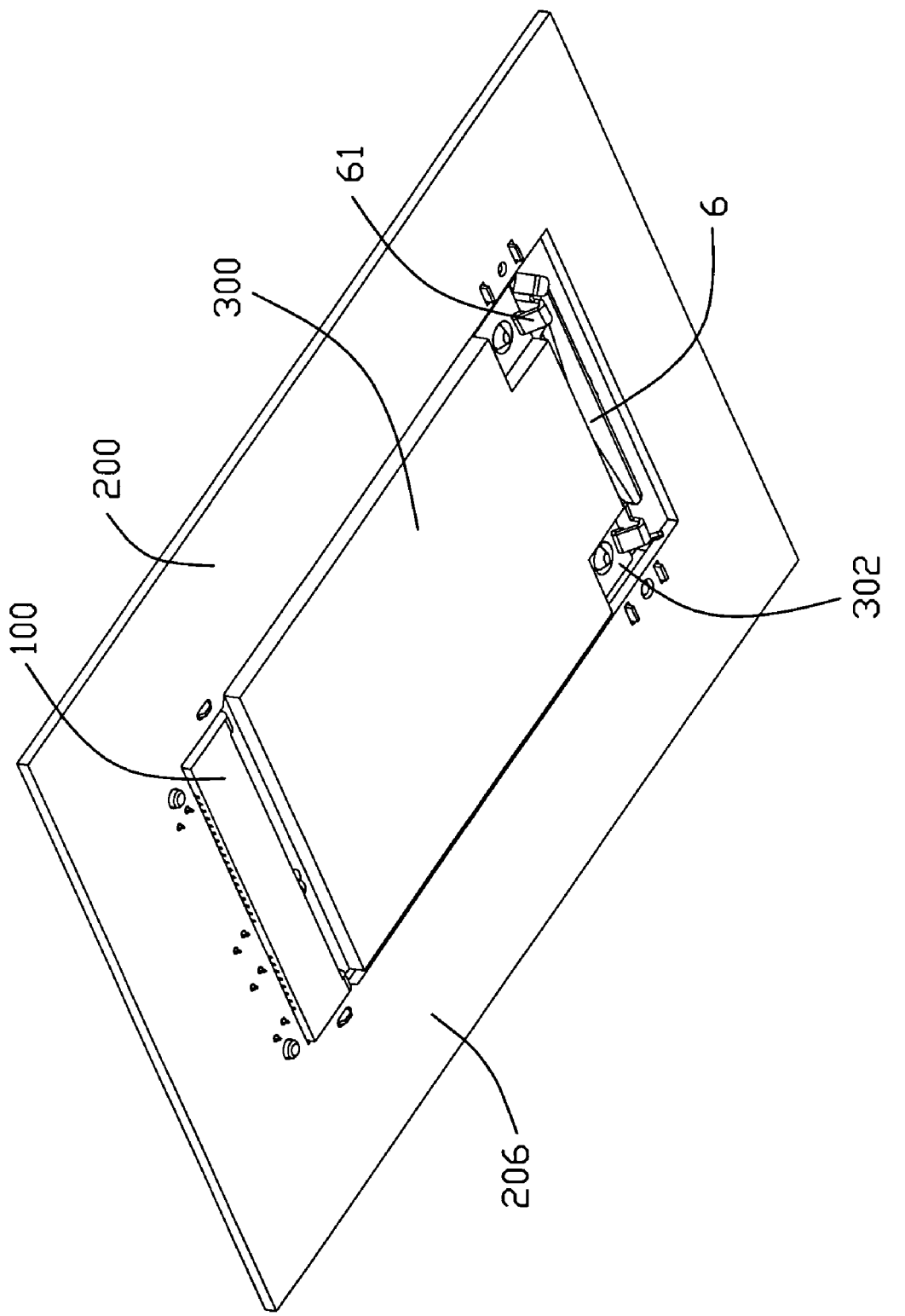
FIG. 6 is a perspective view of a connector assembly wherein the connector is mounted in the PCB and the card is retained in the connector by a latching device.
Figure 7:
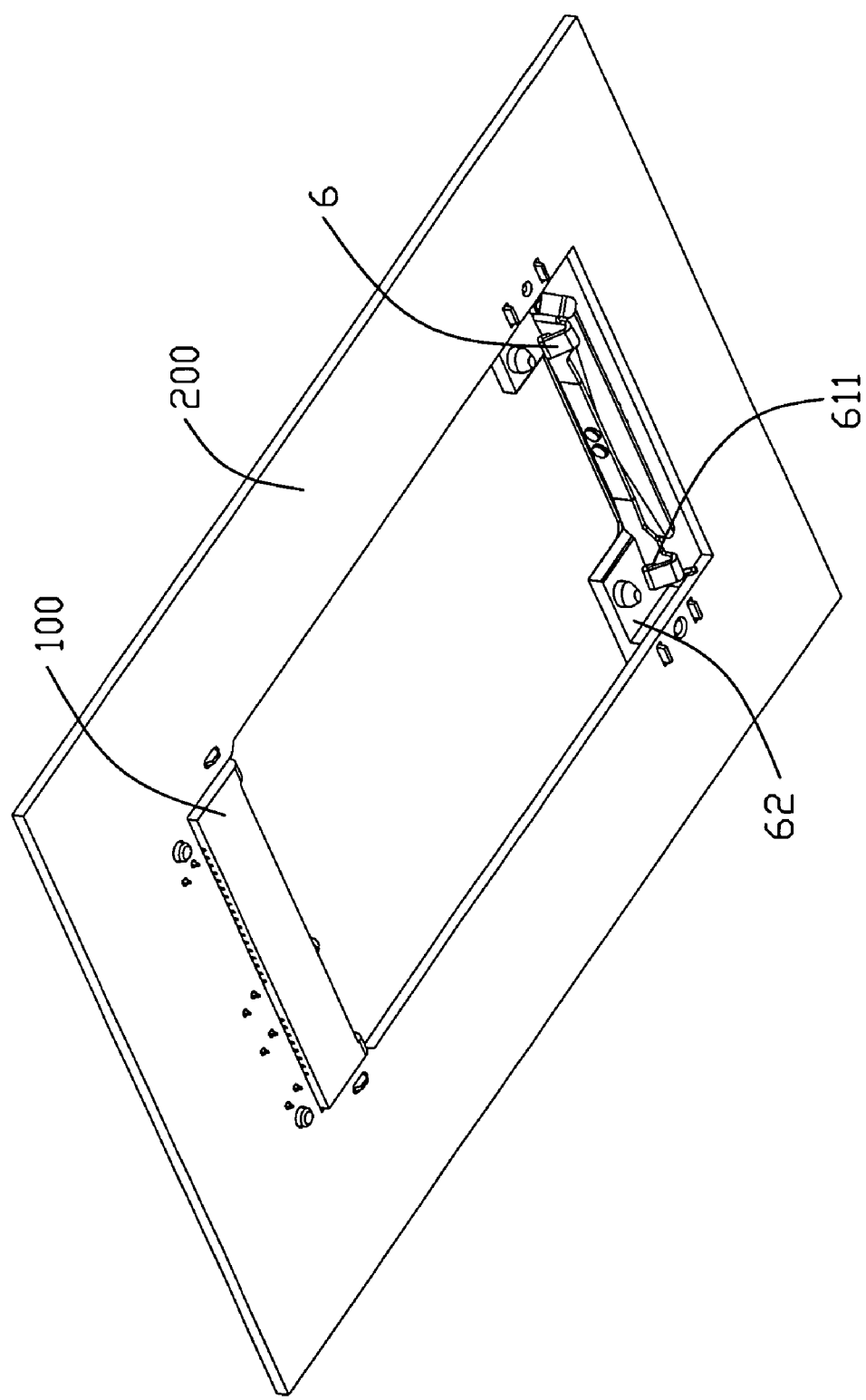
FIG. 7 is an perspective view of the connector assembly showed in FIG. 6 without the card.
Figure 8:
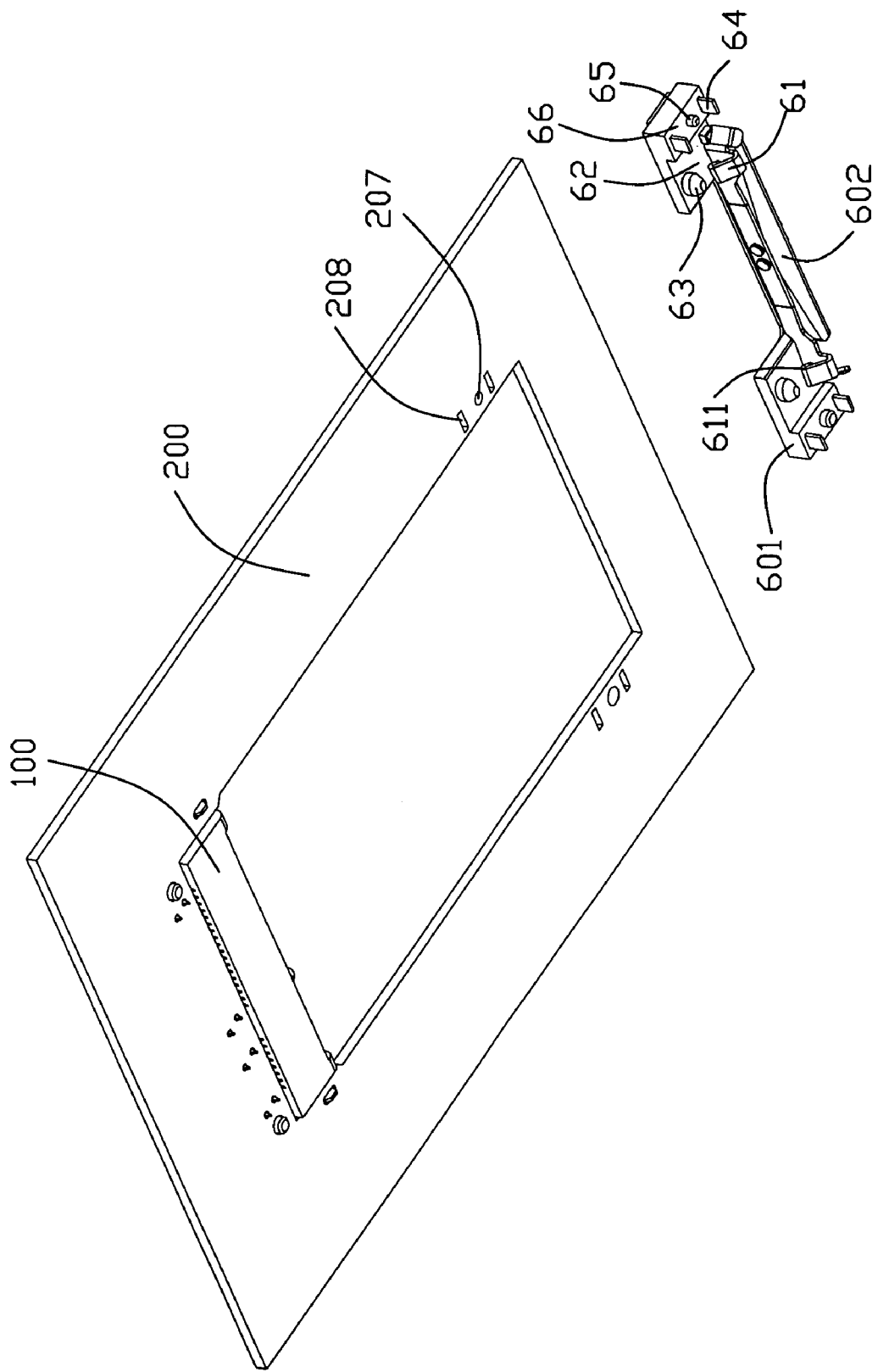
FIG. 8 is an exploded perspective view of the connector assembly shown in FIG. 7.

Referring to FIGS. 6, 7 and 8 showing the usage of the latching device 6, the latching device includes supporting faces 62 facing downward, mounting faces 66 confronting to the PCB and latching portions 61. The latching device is retained in the notch 201 by the mounting faces 66 abutting against the top face 205 of the PCB and a rear retaining portion of the card opposite to the front portion is sandwich between the supporting faces 62 and latching portion 61. The device is substantially C-shaped configuration with two base portions 601 at opposite ends connecting by a bridge portion 602. One supporting face 62 and one mounting face 66 are defined on a bottom face of the base portion 601, wherein the mounting face 66 is lower than the supporting portion 62 with relative to the top face 205 of the PCB. A card-positioning post 63 unitarily extends downward from the supporting face 62. A PCB-positioning post 65 extends downwards from the mounting face 66 to be inserted into a hole 207 in the PCB and a pair of PCB-retaining board locks 64 at sides of the PCB-positioning post 65 project downward from the mounting face 66 to be inserted into the hole 208 in the PCB. A long metal strip is attached on the bridge portion 602 with a bending portion upwards bending toward the supporting face with a distance equaling to the height of the card 300. The bending portion functions as the locking portion 61 with a pressing portion 611 at a front end thereof, confronting to the supporting face 62. Alternatively, the pressing portion is point contact or line contact.

Referring to FIGS. 6 and 7, the supporting faces 62 and the mounting faces 66 are in a same side of the base portion 602 of the latching device 6. In the preferred embodiment, the pressing portion 611 is located in the notch 201 and the supporting faces 62 is higher than the top faces of the PCB to allow the card in the notch for decrease the whole high of the connector and the card. By nature, the height of the supporting faces 62 is designed by the sink-dimension of the card in the notch. Corresponding retain portion 302 sandwiched between the supporting faces 62 and the mounting faces 66 is thinner than the PCB, that causing one of the pressing portion 611 and the supporting portion 62 is in the notch 201 and the other of the pressing portion and the supporting portion is over or below the notch 201, i.e. over the top face 205 of the PCB or below the lower face of the PCB.

However, the disclosure is illustrative only, changes may be made in detail, especially in matter of shape, size, and arrangement of parts within the principles of the invention.

What is claimed is:

1. An edge connector assembly, comprising:
    a Printed Circuit Board (PCB) defining a first face, a second face opposite to the first face thereof and a notch therein;
    a daughter board defining a front mating portion and a rear retaining portion;
    an edge connector mounted in a front portion of the notch of the PCB, comprising:
    an insulating housing defining a longitudinal slot for receiving the front mating portion of the daughter board and a mounting face thereof to abut against one of the first face and the second face of the PCB for mounting the housing to the PCB;
    a plurality of contacts defining contacting portions extending into the slot;
    wherein the daughter board is inserted into slot from the second face of the PCB in a slant direction and then pivots about the front mating portion toward the first face and is retained in the notch.

2. The edge connector assembly as described in claim 1, wherein a latch device is mounted to a rear portion of the notch, and defines a card-positioning post extending in a direction from the first face to the second face.

3. The edge connector assembly as claimed in claim 2, wherein said latch device further defines a supporting face facing in said direction for supporting the daughter board.

4. The edge connector assembly as claimed in claim 3, wherein said supporting face is essentially outside the notch and communicatively facing while being spaced away from the first face with a distance in a vertical direction perpendicular to the first face.

5. The edge connector assembly as claimed in claim 2, wherein said latch device further defines a latching portion for preventing the retaining portion of the daughter card from escaping in said direction.

6. The edge connector assembly as claimed in claim 2, wherein said latch device defines another mounting face abutting against the first face for securing the latching device upon the PCB.

7. The edge connector assembly as claimed in claim 2, wherein once assembled to the connector, the daughter board is closer to the first face of the PCB than the second face of the PCB.

8. The edge connector assembly as described in claim 1, wherein said mounting face abuts against the first face of the PCB.

9. The edge connector assembly as described in claim 8, further comprising a latch device mounted on the PCB opposite to the edge connector, wherein the latching device comprises another mounting face and a pressing portion, and the pressing portion is located near to the second face of the PCB while the mounting face is retained on the first face of the PCB.

10. The edge connector assembly as described in claim 9, wherein the mounting face of the latching device has a board lock which is inserted into the PCB from the first face of the PCB.

11. The edge connector assembly as described in claim 9, wherein the latching device comprises a supporting face facing the pressing portion, the supporting face and the mounting face are on a same side of the latching device.

12. The edge connector assembly as described in claim 11, wherein the pressing portion is in the notch of the PCB and the supporting face is beyond the first face of the PCB.

13. A system, comprising:
- a motherboard extending substantially in a first plane and defining at least an opening having a first end and a second end;
- a connector mounted at the first end;
- a latching device spaced from the connector and mounted at the second end; and
- a card inserted into the connector from a first angle, and then rotated to a position secured by the latching device and which is substantially coplanar with the first plane, and wherein said latching device includes a mounting pad seated onto a first surface of the motherboard, and a latching arm extending beyond a second surface opposite to the first surface.

14. The system as described in claim 13, wherein the latching device includes a pair of positioning post extending from the first surface of the motherboard to the second surface of the motherboard.

15. The system as described in claim 13, wherein the connector defines a mounting portion seated onto the first surface of the motherboard.

16. The system as described in claim 15, wherein the card rotates from the second surface of the motherboard toward the first surface of the motherboard.

\* \* \* \* \*